US010332821B2

(12) United States Patent
Qi et al.

(10) Patent No.: US 10,332,821 B2
(45) Date of Patent: Jun. 25, 2019

(54) PARTIALLY MOLDED DIRECT CHIP ATTACH PACKAGE STRUCTURES FOR CONNECTIVITY MODULE SOLUTIONS

(71) Applicant: Intel IP Corporation, Santa Clara, CA (US)

(72) Inventors: Quan Qi, Beaverton, OR (US); Carlton E. Hanna, Santa Clara, CA (US); Eytan Mann, Modiin (IL); Sidharth Dalmia, Fair Oaks, CA (US)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 16/102,117

(22) Filed: Aug. 13, 2018

(65) Prior Publication Data

US 2019/0067163 A1  Feb. 28, 2019

Related U.S. Application Data

(63) Continuation of application No. 15/474,301, filed on Mar. 30, 2017, now Pat. No. 10,049,961.

(51) Int. Cl.
*H01L 23/498* (2006.01)
*H01L 23/433* (2006.01)
*H01L 23/367* (2006.01)
*H01L 21/48* (2006.01)
(Continued)

(52) U.S. Cl.
CPC ...... *H01L 23/4334* (2013.01); *H01L 21/4814* (2013.01); *H01L 23/3677* (2013.01); *H01L 23/49816* (2013.01); *H01L 23/5389* (2013.01); *H01L 24/19* (2013.01); *H01L 24/96* (2013.01); *H01L 2224/16225* (2013.01)

(58) Field of Classification Search
CPC ........... H01L 23/49822; H01L 23/5389; H01L 23/552; H01L 25/0652; H01L 25/0665; H01L 2223/6677
See application file for complete search history.

(56) References Cited

U.S. PATENT DOCUMENTS 9,780,047 B1 * 10/2017 Jeon ..................... H01L 23/3121
2008/0158063 A1    7/2008 Zeng et al.

FOREIGN PATENT DOCUMENTS

WO    2018063414    4/2018

OTHER PUBLICATIONS

Notice of Allowance for U.S. Appl. No. 15/474,301, dated Mar. 27, 2018.
(Continued)

*Primary Examiner* — Hoai V Pham
(74) *Attorney, Agent, or Firm* — Green, Howard & Mughal LLP.

(57) ABSTRACT

Methods of forming microelectronic package structures/modules, and structures formed thereby, are described. Structures included herein may include a die on a first substrate, at least one first component adjacent the die on the first substrate, and molding material on the first substrate, wherein the at least one component and the die are embedded in the molding material. A second substrate may be physically coupled to the first substrate. A communication structure may be disposed on a top surface of the second substrate, wherein at least one second component may also be located on the top surface of the second substrate.

8 Claims, 8 Drawing Sheets

(51) Int. Cl.
*H01L 23/00* (2006.01)
*H01L 23/538* (2006.01)

(56) References Cited

OTHER PUBLICATIONS

Office Action for U.S. Appl. No. 15/474,301, dated Oct. 23, 2017.

* cited by examiner

PARTIALLY MOLDED DIRECT CHIP ATTACH PACKAGE STRUCTURES FOR CONNECTIVITY MODULE SOLUTIONS

CLAIM OF PRIORITY

This application is a continuation of U.S. patent application Ser. No. 15/474,301, filed Mar. 30, 2017, now patented as U.S. Pat. No. 10,049,961, titled "PARTIALLY MOLDED DIRECT CHIP ATTACH PACKAGE STRUCTURES FOR CONNECTIVITY MODULE SOLUTIONS", of which is incorporated herein by reference in its entirety for all purposes.

BACKGROUND

Connectivity solutions for microelectronic package structures may utilize printed circuit board (PCB) technologies, as well as substrate based silicon in package (SiP) solutions/technologies. PCB based module solutions can provide a significant cost advantage, particularly for mainstream high volume manufacturing (HVM) connectivity products.

BRIEF DESCRIPTION OF THE DRAWINGS

While the specification concludes with claims particularly pointing out and distinctly claiming certain embodiments, the advantages of these embodiments can be more readily ascertained from the following description when read in conjunction with the accompanying drawings in which:

DETAILED DESCRIPTION

Figure 1A:
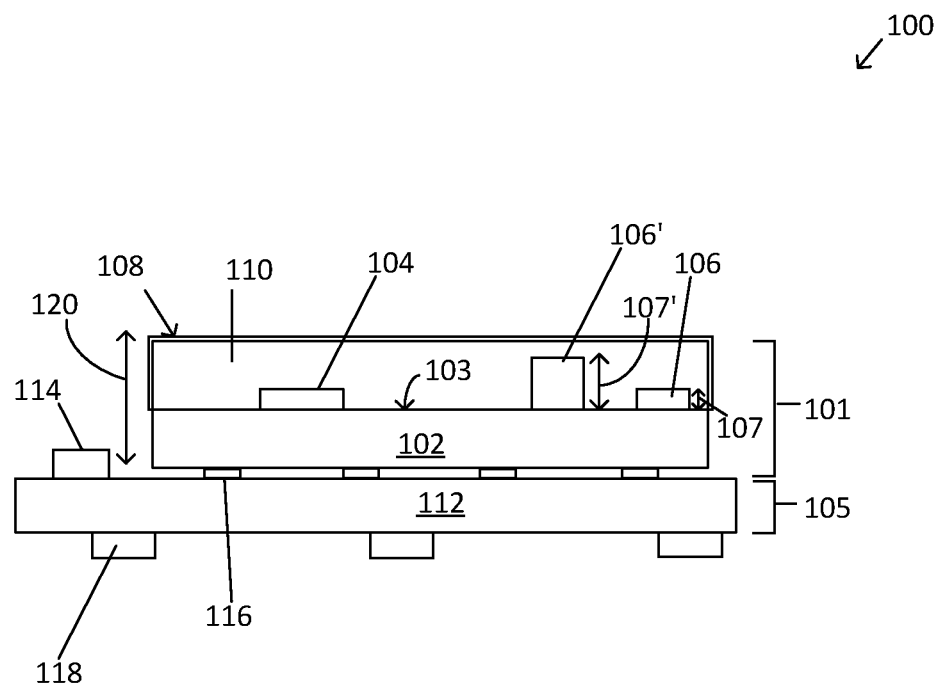
FIG. 1a represents a cross-sectional view of structures according to embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments.

The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views. The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. Layers and/or structures "adjacent" to one another may or may not have intervening structures/layers between them. A layer(s)/structure(s) that is/are directly on/directly in contact with another layer(s)/structure(s) may have no intervening layer(s)/structure(s) between them.

Various implementations of the embodiments herein may be formed or carried out on a substrate, such as a package substrate. A package substrate may comprise any suitable type of substrate capable of providing electrical communications between an electrical component, such as an integrated circuit (IC) die, and a next-level component to which an IC package may be coupled (e.g., a circuit board). In another embodiment, the substrate may comprise any suitable type of substrate capable of providing electrical communication between an IC die and an upper IC package coupled with a lower IC/die package, and in a further embodiment a substrate may comprise any suitable type of substrate capable of providing electrical communication between an upper IC package and a next-level component to which an IC package is coupled.

A substrate may also provide structural support for a die. By way of example, in one embodiment, a substrate may comprise a multi-layer substrate—including alternating layers of a dielectric material and metal—built-up around a core layer (either a dielectric or a metal core). In another embodiment, a substrate may comprise a careless multi-layer substrate. Other types of substrates and substrate materials may also find use with the disclosed embodiments (e.g., ceramics, sapphire, glass, etc.). Further, according to one embodiment, a substrate may comprise alternating layers of dielectric material and metal that are built-up over a die itself—this process is sometimes referred to as a "bumpless build-up process." Where such an approach is utilized, conductive interconnects may or may not be needed (as the build-up layers may be disposed directly over a die, in some cases).

A die may include a front-side and an opposing back-side. In some embodiments, the front-side may be referred to as the "active surface" of the die. A number of interconnects may extend from the die's front-side to the underlying substrate, and these interconnects may electrically couple the die and substrate. In some cases a die may be directly coupled to a board, such as a motherboard. Interconnects/traces may comprise any type of structure and materials capable of providing electrical communication between a die and substrate/board. In some one embodiment, a die may be disposed on a substrate in a flip-chip arrangement. In an embodiment interconnects comprises an electrically conductive terminal on a die (e.g., a pad, bump, stud bump, column, pillar, or other suitable structure or combination of structures) and a corresponding electrically conductive terminal on the substrate (e.g., a pad, bump, stud bump, column, pillar, or other suitable structure or combination of structures).

Solder (e.g., in the form of balls or bumps) may be disposed on the terminals of the substrate and/or die, and these terminals may then be joined using a solder reflow process. Of course, it should be understood that many other types of interconnects and materials are possible (e.g., wirebonds extending between a die and substrate). In some embodiments herein, a die may be coupled with a substrate by a number of interconnects in a flip-chip arrangement. However, in other embodiments, alternative structures and/or methods may be utilized to couple a die with a substrate.

Embodiments of methods of forming packaging structures, including methods of forming connectivity modules, such as partially molded direct chip attach die (DCA) connectivity solutions/structures, are described. Those methods/structures may include a die on a first substrate, at least one first component adjacent the die on the first substrate, and molding material on the first substrate, wherein the at least one component and the die are embedded in the molding material. A top surface of a second substrate may comprising a communication structure disposed thereon, and may be physically coupled to the first substrate, wherein at least one second component may further be disposed on the top surface of the second substrate. The embodiments herein enable flexibility in the design of low cost, electromagnetic interference (EMI) shielded connectivity modules solutions comprising exposed wireless connector structures, for example.

The Figures herein illustrate embodiments of fabricating package structures/modules comprising partially molded (wherein some components, such as some antenna structures, may not be disposed within a molding compound) DCA connectivity solutions/structures. In FIG. 1a (cross-sectional view), a portion of a package structure 100, such as a direct chip attach (DCA) connectivity package structure/module 100, is shown. In an embodiment, a first substrate 102, may comprise a board, such as a printed circuit board (PCB board), for example, and in other embodiments, the first substrate 102 may comprise a high density PCB, wherein routing/interconnect lines within the board may comprise about 40/40 microns trace/spacing line/space (LIS) design rules. In other embodiments, the first substrate 102 may comprise below about 40/40 micron LIS, and may comprise about 25/25 micron LIS in some cases.

In an embodiment, a die/device 104, such as a microelectronic die, may be disposed on a top surface 103 of the first substrate 102. In an embodiment, the die 104 may comprise any type of microelectronic device, including devices comprising wireless capabilities, such as but not limited to a microprocessor, a graphics processor, a signal processor, a network processor, a chipset, etc. In one embodiment, the die 104 comprises a system on a chip (SOC) having multiple functional units (e.g., one or more processing units, one or more graphics units, one or more communications units, one or more signal processing units, one or more security units, etc.). However, it should be understood that the disclosed embodiments are not limited to any particular type or class of die/devices. The device/die 104 may be electrically and physically coupled with the first substrate/board 102 by solder balls/conductive structures (not shown). In an embodiment, more than one die 104 may be disposed on the top surface 103 of the first substrate 102. In an embodiment, the die 104 may comprise a bare die.

At least one component 106 (shown as two components 106, 106' for illustration purposes) may be disposed adjacent the die 104 on the top surface 103 of the first substrate 102. The at least one component 106 may comprise such components as a die-side capacitor, an inductor, a component comprising a crystal oscillator for example. In an embodiment, the at least one component 106 may comprise any other type of circuit elements/devices, such as a resistor, for example, and individual ones of the at least one component 106 may comprise different heights from each other. For example, the component 106 may comprise a height 107 that may be less than a height 107' of the component 106', in an embodiment. In an embodiment, the height 107' may be at least about 10 percent higher than the height 107 of the component 106. In other embodiments, the height 107' of the component 106' may be about twice as high or higher than the height 107 of the component 106. The various heights of the at least one component 106, 106' may vary depending upon the design requirements of the particular application.

A molding material 110 may be disposed on the die 104 and the at least one component 106. The molding material 110 may comprise an epoxy material in an embodiment, or may comprise any other suitable material as required by the particular application. In an embodiment, the molding material 110 may comprise a molding underfill material (MUF), wherein the die 104 and the at least one component 106 may be fully embedded within the molding material 110. A shielding material 108, such as an electromagnetic interference (EMI) shield material, may be disposed on a top surface and at least one side of the molding material 110. The shielding material 108 may comprise a conductive material, such as copper, for example, or may comprise such materials as composite materials including a metal layer. The shielding material 108 may comprise a sputtered conductive material in an embodiment, and may comprise a thickness of about 3 microns to about 7 microns, in an embodiment.

The shielding material 108 may serve to protect/shield the device 100 from un-desired EMI/RF radiation/signals. In an embodiment, the first substrate 102 comprising the molding material 110, embedded die 104 and components 106, and shielding material 108 may comprise a first portion 101 of the (DCA) connectivity module 100. In an embodiment, the first portion 101 of the DCA connectivity module 100 may comprise a Z height 120. In an embodiment, the first substrate 102 of the first portion 101 of the module 100 may be utilized to support the routing needs & assembly requirements of surface mount (SMT) components, molding fabrication operations, as well as EMI shielding operations/fabrication processes.

In an embodiment, the first substrate 102 may be disposed on a second substrate 112. The first substrate 102 may be attached/physically and electrically coupled to the second substrate 112 by conductive interconnect structures 116. In an embodiment, the conductive interconnect structures 116 may comprise solder joints, bumps, conductive epoxy or any other suitable conductive interconnect material. The second substrate 112 may comprise a communication structure 114 disposed on a top surface, which may comprise a wireless communication structure 114. In an embodiment, the second substrate 112 comprising the communication structure 114 may comprise a second portion 105 of the DCA connectivity module 100. The second substrate 112 may further comprise conductive interconnect structures 118 on a bottom surface.

In an embodiment, the communication structure 114 may comprise an antenna structure 114 and/or a wireless connector structure. The communication structure 114 may serve to allow for wireless communication between the package structure 100 and external and/or internal components/devices, in an embodiment. In an embodiment, the second substrate 112 may comprise a low routing density PCB in an embodiment, wherein the routing density may be sufficient to accommodate the routing requirements of the communication structure 114 and any other components disposed on the second substrate 112, but may not comprise the routing density needed for the components and die(s) disposed on the first substrate 102. In an embodiment, the second substrate 112 may comprise a routing density that is greater than about 40/40 LIS design rules. In an embodiment, the LIS density of the second substrate 112 may be less than the LIS density of the first substrate 102.

In an embodiment, the second substrate 112 may comprise a low cost substrate, wherein the second substrate 112 may comprise a 1-2 layer PCB and may accommodate land grid array (LGA) and/or ball grid array (BGA) solder down attachment of the connector structure 114, but may not comprise sufficient routing density to accommodate surface mount technology (SMT) components, molding material such as molding underfill, EMI shielding, and silicon die, which may be supported by the routing density of the first substrate 102.

Figure 1B:
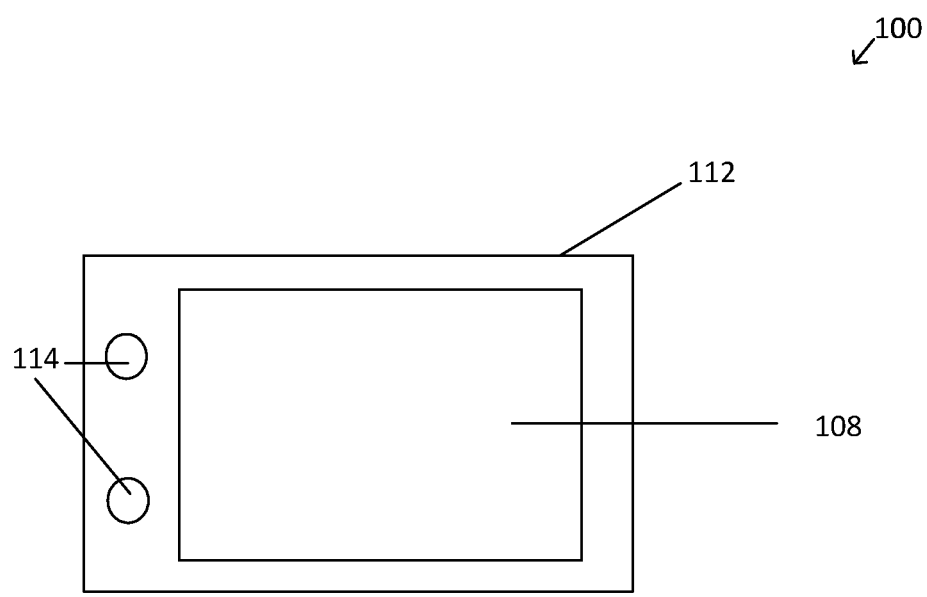
FIG. 1b represents a top view of structures according to embodiments.
Figure 1C:
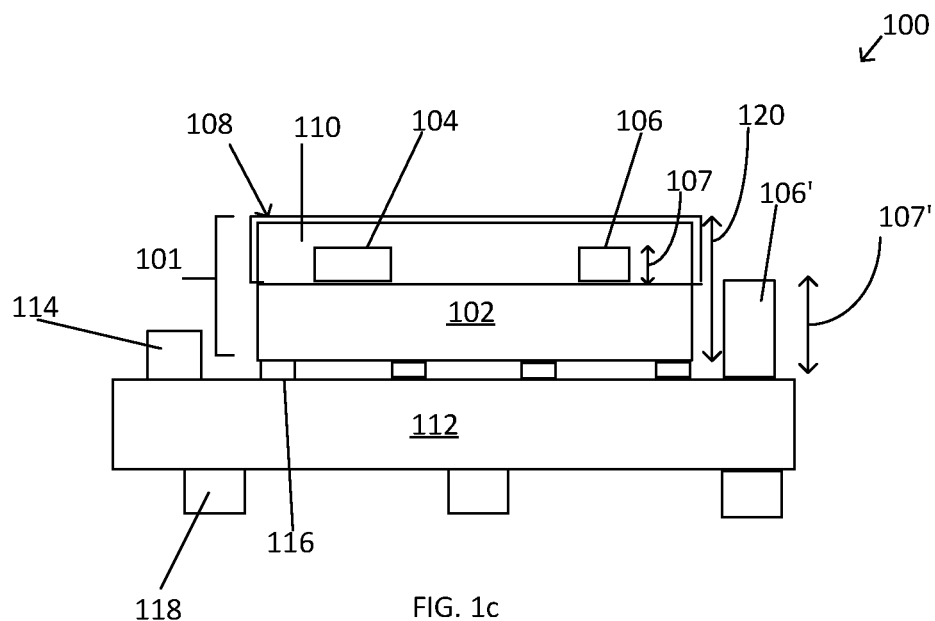
FIG. 1c represents a cross-sectional view of structures according to embodiments.

FIG. 1b depicts a top view of the device/package structure 100 of FIG. 1a, wherein the communication structure(s) 114 is/are disposed on the second substrate 112 adjacent the shield material/structure 108. FIG. 1c depicts an embodiment wherein at least one component 106' may be disposed on a top surface of the second substrate 112. The at least one component may comprise a tall component 106', wherein the tall component 106' may comprise a height 107' that is higher than a height 107 a second component 106 that is disposed on the first substrate 102. In an embodiment, the height 107' of the tall component 106 may be at least about 10 percent higher than the height 107 of the component disposed on the first substrate 102. By placing the tall component 106' on the second substrate 112, a Z height 120 of the first portion of the DCA module 101 may be lower than a Z height of a DCA module with a tall component disposed on the first substrate 102, such as the DCA module depicted in FIG. 1a, for example.

Figure 1D:
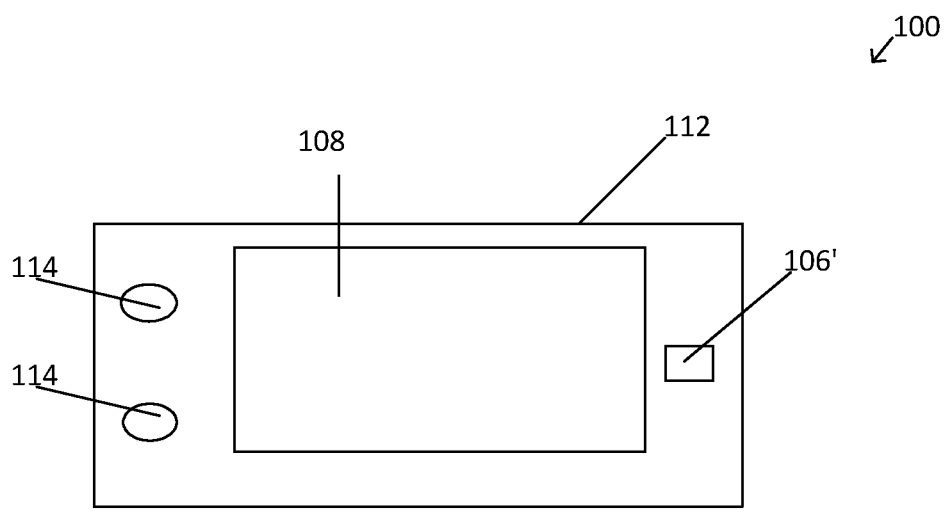
FIG. 1d represents a top view of structures according to embodiments.
Figure 1E:
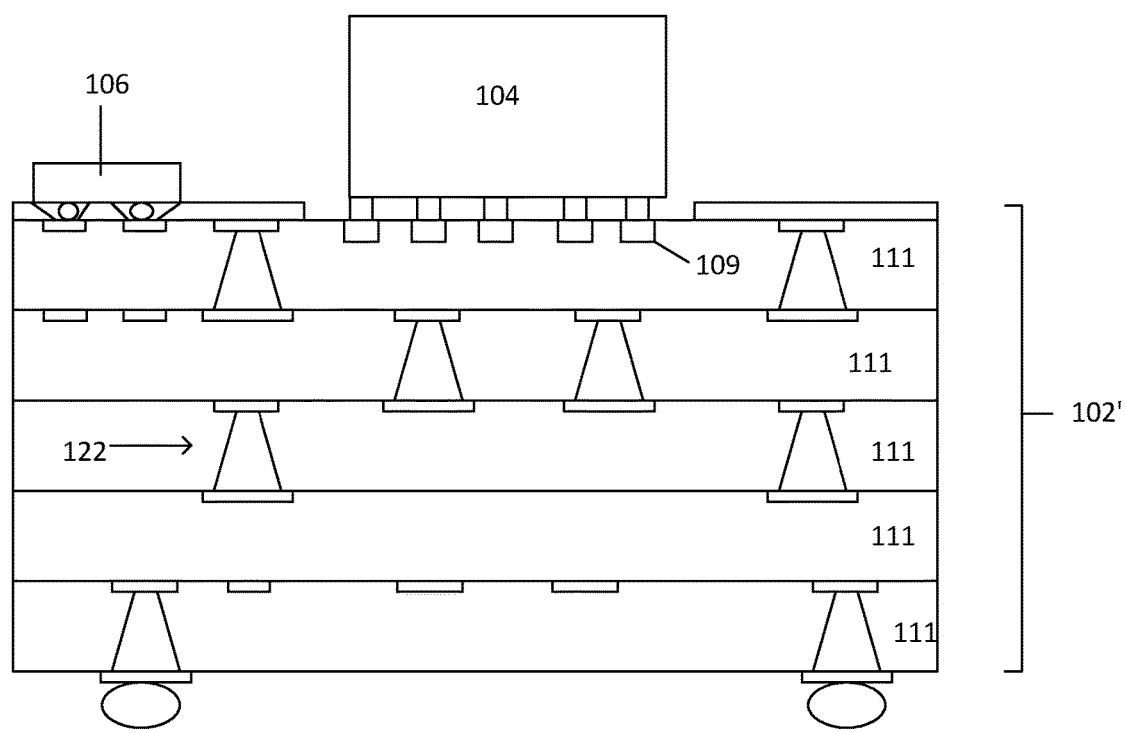
FIGS. 1e-1g represent cross sectional views of structures according to embodiments.

FIG. 1d depicts a top view of the package structure/DCA module of FIG. 1c, wherein a component 106', such as a tall component, may be disposed on the second substrate 112, and wherein communication structures 114 may also be disposed on the second substrate 112. In an embodiment, both the component 106' and the communication structures(s) 114 may be adjacent the shield material 108 disposed on a top surface of the mold material 110, and may not be disposed below the footprint of the first substrate 102. In another embodiment, a first substrate 102' that may be included in any of the embodiments described herein, may comprise an embedded trace PCB (ETP) (FIG. 1e). The ETP substrate 102' may comprise embedded traces 109 (as well as various conductive contact and via structures 122, for example) disposed in a dielectric material 111, wherein a die/device 104 may be physically and electrically coupled to the embedded traces.

The embedded traces 109 may comprise trace/spacing of about 12/12 microns down to about 7/7 microns, in some embodiments. Thus the employment of an ETP substrate as a first substrate 102 in the modules/structures described herein serves to improve routing capacity of the module, and ensures efficient routing with reduced layer counts per Z-height, as well as accommodating SMT assembly/components 106, molding underfill and EMI shielding (not shown). In an embodiment, the ETP substrate 102' may be disposed on a second substrate, such as second substrates 112 of either FIG. 1a or FIG. 1c, for example. In an embodiment, when the ETP substrate is utilized in the module of FIG. 1c, overall z-height is further reduced along with the thinner ETP substrate 102', as a result of the reduced layer counts of the ETP substrate 102'.

Figure 1F:
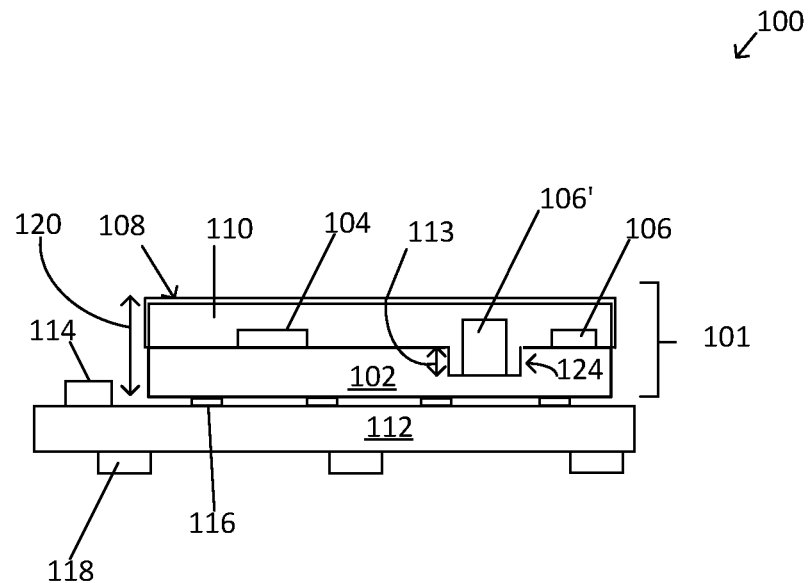

In another embodiment, a tall component 106' may be assembled inside a cavity 124 of a first substrate 102 (FIG. 1f). The cavity 124 may comprise a height 113. The height 113 may vary depending upon the particular application, and may be adjusted for the height of the tall component. In addition, the tall component 106' may be disposed at least partially within the cavity 124, and in other embodiments, may be disposed fully within the cavity 124. Assembling/disposing the tall component 106' into the cavity 124 serves to reduce the overall z-height 120 of the first portion 101 of the module/package structure 100.

A second component 106, which may comprise a shorter height, may be disposed on a top surface of the first substrate 102, and may be adjacent the tall component 106' disposed at least partially within the cavity 124. A die/device 104 may be disposed as well on a top surface of the first substrate 102. A molding material 110, such as a molding underfill material, may be disposed on the device 104, the tall component 106' and the second component 106, and a shielding material/structure 108 may be disposed on the mold material 110. The first substrate 102 may be disposed on the second substrate 112, wherein the second substrate 112 may comprise a communications structure 114 on a top surface of the second substrate 112. Conductive interconnect structures 118 may be disposed on a bottom surface of the second substrate 112. In an embodiment, the second substrate 112 may comprise a low cost, low routing density PCB.

Figure 1G:
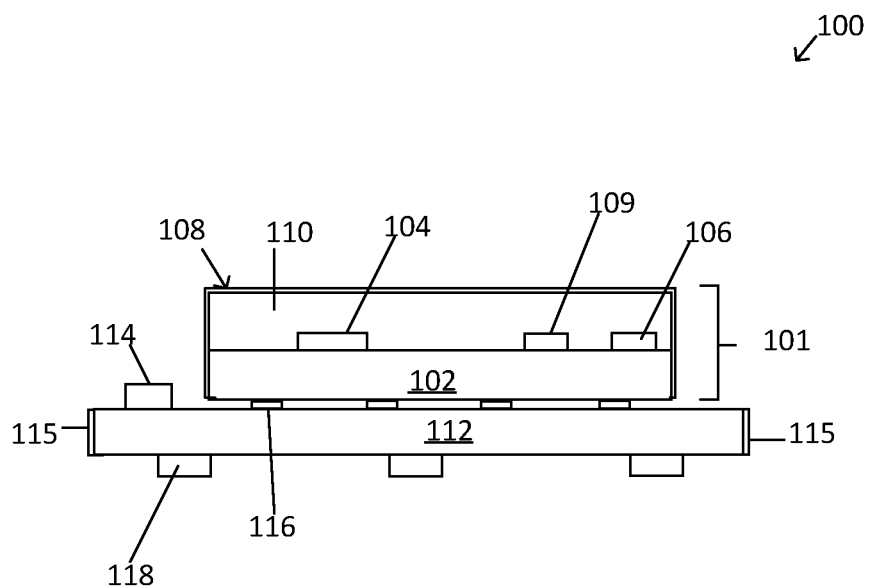

FIG. 1g depicts a portion of a package structure/communications module 100, wherein a second substrate 112 may comprise a low cost PCB, wherein the second substrate 112 provides connection to conventional communication structures 114, such as connectors and/or antenna structures, for example. The first substrate 102 may comprise a high-density substrate, an embedded trace substrate (ETS) or an embedded trace PCB. The first substrate 102 may be physically coupled to the second substrate 112 with connective interconnects 116. The first substrate 102 may comprise an integrated substrate front end, and may comprise at least one die 104, at least one component 106, such as an SMT component, and/or may comprise at least one embedded substrate front end (eSFE) component 109. The embedded substrate front end component 109 may comprise multiple components assembled in a single package, in an embodiment, and may support enhanced RF performance. The iSFE provides the ability to eliminate tall bulky discrete SMT components such as diplexers, filters, baluns, and couplers, by implementing their functions such as the inductors and capacitors needed, in a high density substrate. In an embodiment, the second substrate 112 may comprise edge shielding structures 115, which may comprise conductive materials such as sputtered copper for example, to further enhance RF performance/applications.

Figure 1H:
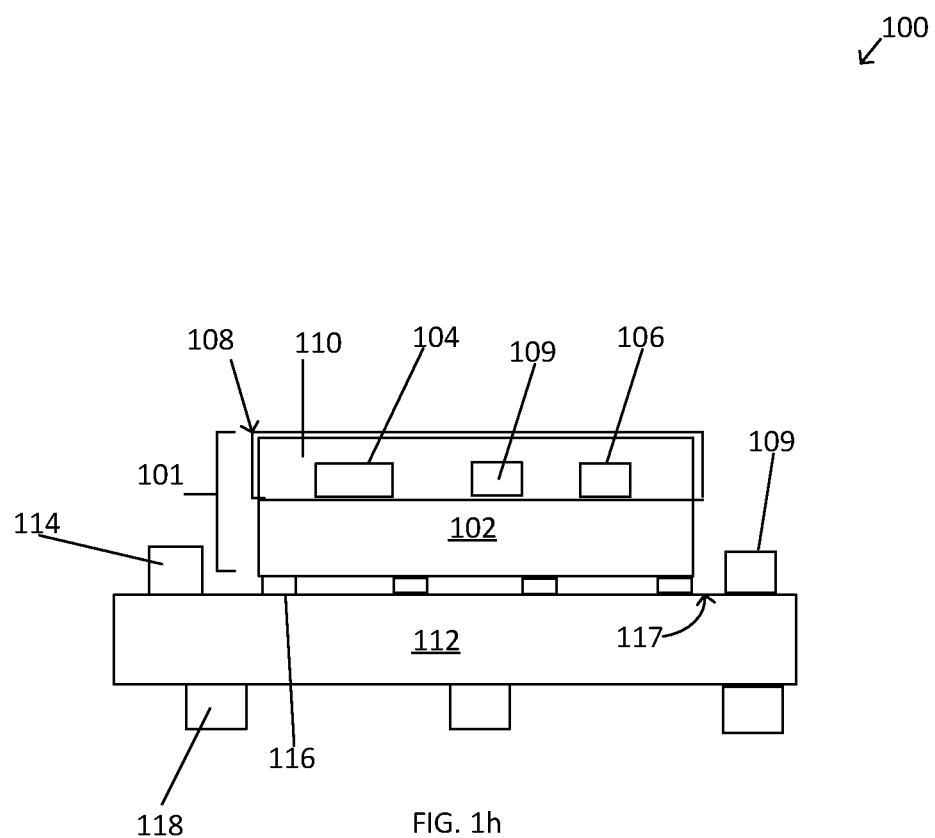

A molding material 110 may be disposed on the components and devices disposed on the first substrate 102, and EMI shielding 108 may be disposed on top surface and sidewalls of the molding material 110, as well as on sidewalls of the first substrate 102, in an embodiment. In another embodiment, the first substrate 102 may comprise an ETS substrate, and may support/comprise high-density die 104 signal escape, SMT component assembly 106 (including an eSFE component 109 to reduce the overall numbers of passive components to be employed), mold underfill 110 and EMI shielding 108 (FIG. 1h). The first substrate 102 may be disposed on a second substrate 112, wherein the second substrate 112 may incorporate embedded integrated substrate front end processing, and may comprise a high density substrate 112, which may accommodate additional SMT components (not shown) and/or eSFE components 109 disposed on a top surface 117 thereon. The top surface 117 of the high density second substrate 112 may further comprise communication assemblies/structures 114. In an embodiment, the second substrate 112 may optionally comprise edge shielding structures 115 (not shown), which may comprise conductive materials such as sputtered copper for example, to further enhance RF performance/applications. In an embodiment, the top portion 101 alone can serve as a SiP module solution (without the connector structures), wherein an even lower Z height solution may be desired. The top portion 101 may then be assembled onto a board, such as a mother board, directly, in an embodiment. In an embodiment, the solder ball connections 116 between the first and second substrates 102, 112 can be used for shielding by using the principle of a faraday cage. The tight spacing of ground connections on 116 on a peripheral area can provide excellent shielding as well.

The various embodiments of the package assemblies/structures describe herein a new approach to build modules by directly assembling silicon devices onto PCB carriers, for example. For DCA connectivity modules, molded solutions possess the advantage of providing superior physical protection to bare silicon devices than lidded shield solutions. The structures herein enable the reduction of form factor while integrating antenna and improving coupling efficiency. Embodiments include DCA connectivity modules comprising two portions: one portion with a PCB that may accommodate components, die etc., and another portion comprising a connector and/or an integrated antenna.

In some embodiments, ETP substrates may be employed in the first portion of the module to increase routing capacity from standard routing capabilities of high density interface (HDI) PCB technologies, for example. ETP substrates enable design feasibility while reduced the number of layers within a first substrate, and consequently reducing Z height. The second portion of the connectivity modules described herein comprise one-or-two layer, "low cost" PCB second substrate structures with connectors and/or antenna disposed thereon. Connections between the two substrates may be achieved with solder joint, or conductive epoxy or regular epoxy if efficient coupling can be achieved without wires. Embodiments include the "off-loading" of tall components to the second substrate, as well as placing components within a cavity of the second substrate, to reduce Z height/form factor. In a further embodiment, any of the portions or the entire module/package structures of the embodiments herein can be disposed within a cavity of a board, such as within a cavity of a PCB or a motherboard. Such a package structure possess even further EMI protection by using edge plated cavity walls, and/or tightly spaced microvia walls.

Figure 2:
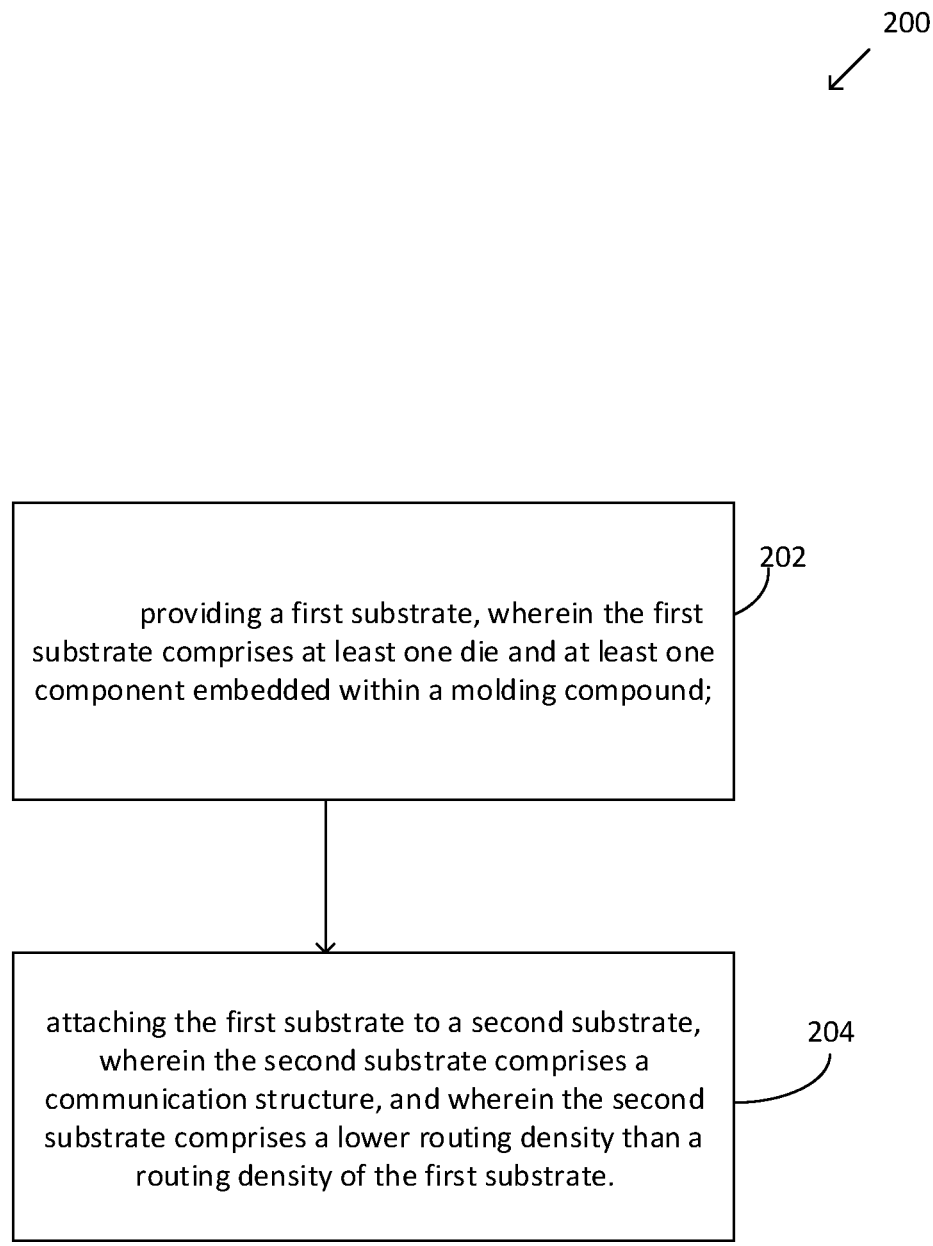
FIG. 2 represents a flow chart of a method according to embodiments.

FIG. 2 depicts a method 200 of forming a package structure according to embodiments herein. At step 202, a first substrate may be provided, wherein the first substrate comprises at least one die and at least one component embedded within a molding compound. At step 204, the first substrate may be attached to a second substrate, wherein the second substrate comprises a communication structure on a top surface of the second substrate, and wherein the second substrate comprises a lower routing density than a routing density of the first substrate. The second substrate may comprise an antenna and/or connector disposed on the top surface, as well as additional components such as SMT components disposed on the top surface. The second substrate may not comprise molding material, in an embodiment.

The structures of the embodiments herein may be coupled with any suitable type of structures capable of providing electrical communications between a microelectronic device, such as a die, disposed in package structures, and a next-level component to which the package structures may be coupled (e.g., a circuit board). The device/package structures, and the components thereof, of the embodiments herein may comprise circuitry elements such as logic circuitry for use in a processor die, for example. Metallization layers and insulating material may be included in the structures herein, as well as conductive contacts/bumps that may couple metal layers/interconnects to external devices/layers. In some embodiments the structures may further comprise a plurality of dies, which may be stacked upon one another, depending upon the particular embodiment. In an embodiment, the die(s) may be partially or fully embedded in a package structure.

The various embodiments of the package structures included herein may be used for system on a chip (SOC) products, and may find application in such devices as smart phones, notebooks, tablets, wearable devices and other electronic mobile devices. In various implementations, the package structures may be included in a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder, and wearable devices. In further implementations, the package devices herein may be included in any other electronic devices that process data.

Figure 3:
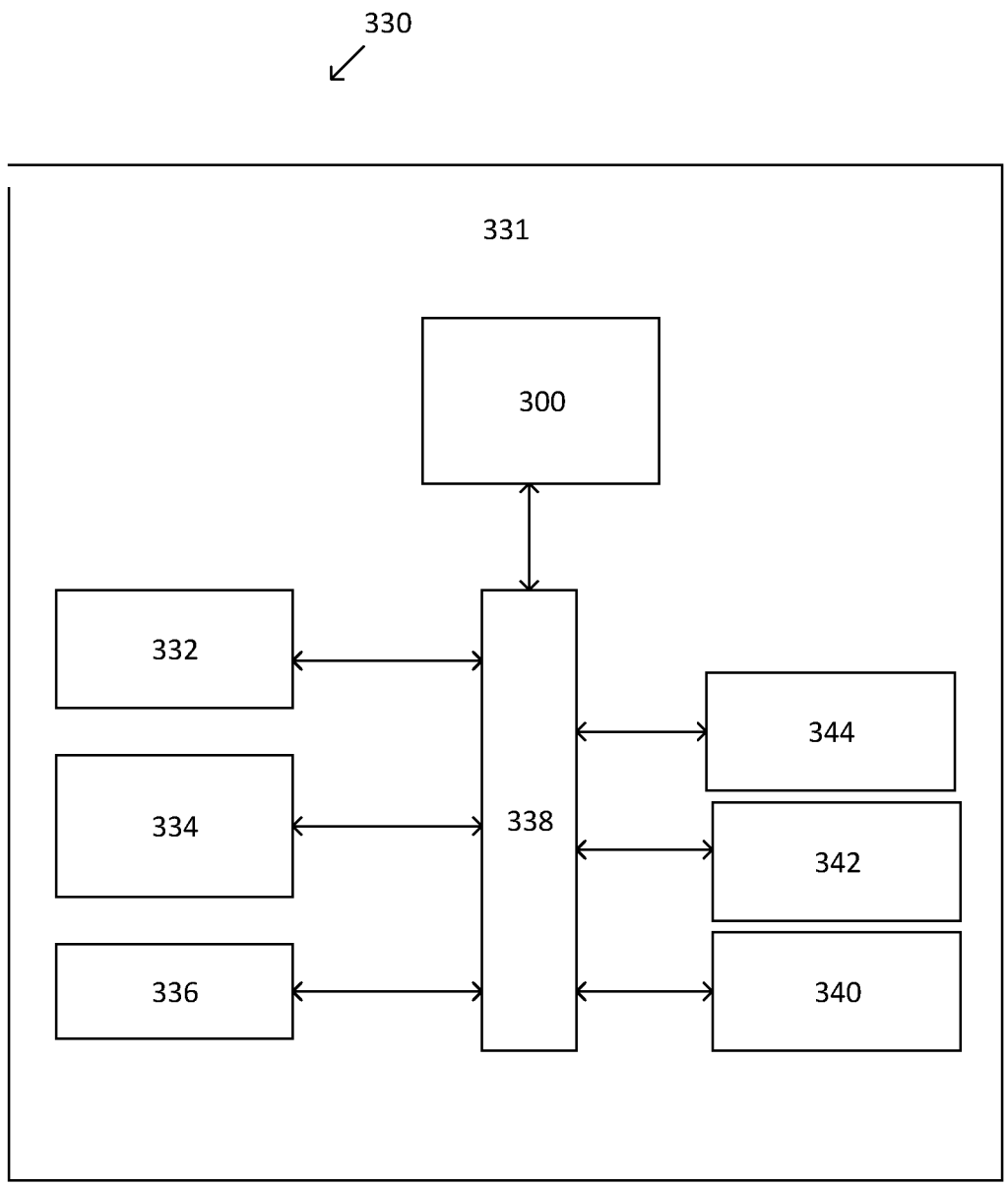
FIG. 3 represents a schematic of a computing system according to embodiments.

Turning now to FIG. 3, illustrated is a schematic of an embodiment of a portion of a computing system 330, including one or more of the modules/package structures 300 of the embodiments included herein. The module 300 may include any or all of the elements of the embodiments included herein as a part of the system 330.

In some embodiments, the system 330 includes a processing means such as one or more processors 332 coupled to one or more buses or interconnects, shown in general as bus 338. The processors 332 may comprise one or more physical processors and one or more logical processors. In some embodiments, the processors may include one or more general-purpose processors or special-processor processors.

The bus 338 may be a communication means for transmission of data. The bus 338 may be a single bus for shown for simplicity, but may represent multiple different interconnects or buses and the component connections to such interconnects or buses may vary. The bus 338 shown in FIG. 3 is an abstraction that represents any one or more separate physical buses, point-to-point connections, or both connected by appropriate bridges, adapters, or controllers. In some embodiments, the system 330 further comprises a random access memory (RAM) or other dynamic storage device or element as a main memory 334 for storing information and instructions to be executed by the processors 332. Main memory 334 may include, but is not limited to, dynamic random access memory (DRAM). The system 330 also may comprise one or more passive devices 336, such as capacitors and inductors that may be installed on a board, such as a printed circuit board 331.

In some embodiments, the system 330 includes one or more transmitters or receivers 340 coupled to the bus 338. In some embodiments, the system 330 may include one or more antennae 344 (internal or external), such as dipole or monopole antennae, for the transmission and reception of data via wireless communication using a wireless transmitter, receiver, or both, and one or more ports 342 for the transmission and reception of data via wired communications. Wireless communication includes, but is not limited to, Wi-Fi, Bluetooth™, near field communication, and other wireless communication standards. In an embodiment an antenna may be included in the module 300, as described herein.

System 300 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Figure 4:
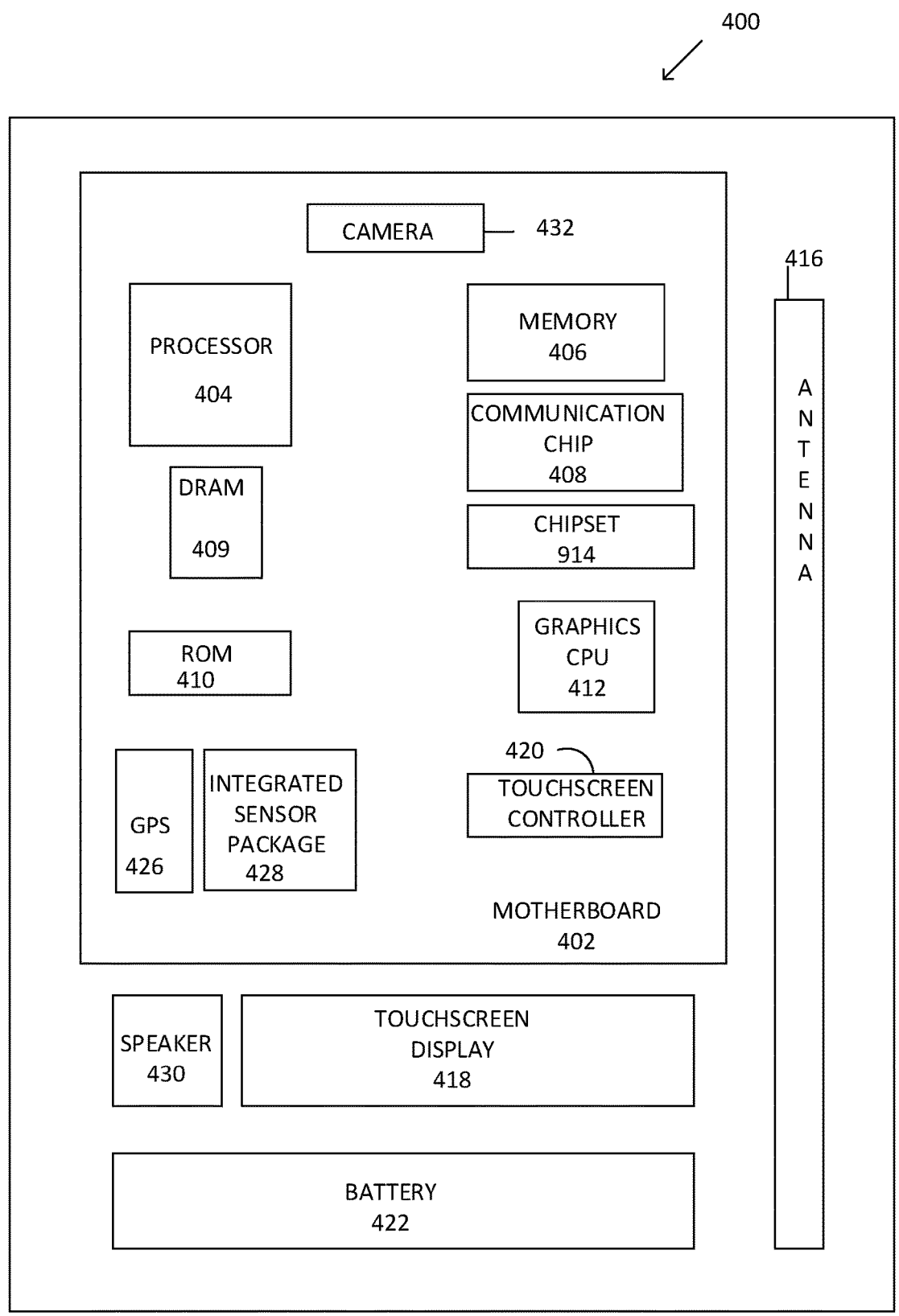
FIG. 4 represents a schematic of a computing device according to embodiments.

FIG. 4 is a schematic of a computing device 400 that may be implemented incorporating embodiments of the package structures described herein. For example, any suitable ones of the components of the computing device 400 may include, or be included in, a package structure, such as package structure 100 of FIG. 1a, for example, or in accordance with any of the embodiments disclosed herein. In an embodiment, the computing device 400 houses a board 402, such as a motherboard 402 for example. The board 402 may include a number of components, including but not limited to a processor 404, an on-die memory 406, and at least one communication chip 408. The processor 404 may be physically and electrically coupled to the board 402. In some implementations the at least one communication chip 408 may be physically and electrically coupled to the board 402. In further implementations, the communication chip 408 is part of the processor 404.

Depending on its applications, computing device 400 may include other components that may or may not be physically and electrically coupled to the board 402, and may or may not be communicatively coupled to each other. These other components include, but are not limited to, volatile memory (e.g., DRAM) 409, non-volatile memory (e.g., ROM) 410, flash memory (not shown), a graphics processor unit (GPU) 412, a chipset 414, an antenna 416, a display 418 such as a touchscreen display, a touchscreen controller 420, a battery 422, an audio codec (not shown), a video codec (not shown), a global positioning system (GPS) device 426, a speaker 430, a camera 432, compact disk (CD) (not shown), digital versatile disk (DVD) (not shown), and so forth). These components may be connected to the system board 402, mounted to the system board, or combined with any of the other components.

The communication chip 408 enables wireless and/or wired communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 408 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TOMA, DECT, Bluetooth, Ethernet derivatives thereof, as well as any other wireless and wired protocols that are designated as 3G, 4G, 5G, and beyond. The computing device 400 may include a plurality of communication chips 408. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 400 may be a laptop, a netbook, a notebook, an ultrabook, a smartphone, a tablet, a personal digital assistant (PDA), an ultra mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Embodiments of the package structures described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

EXAMPLES

Example 1 is a microelectronic package structure comprising a die on a first substrate, at least one component adjacent the die on the first substrate, a molding material on the die and the at least one component, wherein the die and the at least one component are completely embedded in the molding material, a second substrate, wherein the first substrate is disposed on the second substrate; and a communication structure disposed on the second substrate, wherein the communication structure is adjacent a footprint of the first substrate.

Example 2 includes the microelectronic package structure of example 1 wherein the second substrate does not comprise the molding material on a top surface of the second substrate.

Example 3 includes the microelectronic package structure of example 1 wherein the second substrate comprises low density routing printed circuit board (PCB).

Example 4 includes the microelectronic package structure of example 1 wherein a shielding material is disposed on a top surface of the molding material.

Example 5 Includes the microelectronic package structure of example 1 wherein a footprint of the first substrate does not overlap the communication structure.

Example 6 includes the microelectronic package structure of example 1 wherein the second substrate comprises an embedded trace substrate.

Example 7 includes the microelectronic package structure of example 7 wherein at least one of the at least one component is disposed within a cavity of the first substrate.

Example 8 includes the microelectronic package structure of example 1 wherein the first substrate comprises a multiple component structure disposed on a top surface of the first substrate.

Example 9 is a microelectronic package structure comprising a die on a first substrate; at least one first component adjacent the die on the first substrate; molding material on the first substrate, wherein the at least one first component and the die are embedded in the molding material; a second substrate comprising a communication structure on a top surface of the second substrate, wherein the first substrate is disposed on the second substrate; and at least one second component on a top surface of the second substrate.

Example 10 includes the microelectronic package structure of example 9 wherein the at least one second component comprises one of a capacitor, a resistor or an inductor.

Example 11 includes the microelectronic package structure of example 10 wherein the molding material is not disposed on a top surface of the second substrate and is not disposed on the at least one second component.

Example 12 includes the microelectronic package structure of example 9 wherein the second substrate comprises an edge shielding structure.

Example 13 includes the microelectronic package structure of example 9 wherein a top surface of the first substrate comprises an external front end component adjacent the die.

Example 14 includes the microelectronic package structure of example 9 wherein the molding material comprises an RF shielding material on a top surface and on a side surface of the molding material.

Example 15 includes the microelectronic package structure of example 9 wherein a top surface of the second substrate comprises a wireless connector, wherein the connector is adjacent an edge of the first substrate.

Example 16 Includes the microelectronic package structure of example 9, wherein a top surface of the second substrate comprises an external substrate front end component adjacent the die.

Example 17 is a system comprising: a processor for processing data; a memory for storage of data; a transmitter or receiver for transmission and reception of data; and a module including: a die on a first substrate; at least one component adjacent the die on the first substrate; a molding material on the die and the at least one component, wherein the die and the at least one component are completely embedded in the molding material; a second substrate, wherein the first substrate is disposed on the second substrate; and a connector disposed on a top surface of the second substrate, wherein the connector is adjacent the first substrate.

Example 18 includes the system of example 17 wherein the second substrate does not comprise the molding material on a top surface.

Example 19 includes the method of example 17 wherein the second substrate comprises a low density substrate.

Example 20 includes the system of example 17 further comprising wherein RF shielding is disposed on a portion of the top surface of the molding material.

Example 21 includes the system of example 17 further comprising wherein the second substrate comprises an embedded trace substrate on a top surface.

Example 22 includes the system of example 17 further comprising wherein the connector comprises an antenna.

Example 23 includes the system of example 17 wherein the second substrate further comprises an external substrate front end component disposed on a top surface of the second surface.

Example 24 includes the system of example 17 wherein the at least one component comprises at least one of a die side capacitor, an inductor or a resistor.

Example 25 includes the system of example 17 wherein the die comprises a wireless die or a system on a chip.

Example 26 is a method of forming a microelectronic package structure, comprising: providing a first substrate, wherein the first substrate comprises at least one die and at least one component embedded within a molding compound; and attaching the first substrate to a second substrate, wherein the second substrate comprises a communication structure on a top surface, and wherein the second substrate comprises a lower routing density than a routing density of the first substrate.

Example 27 includes the method of forming the microelectronic package structure of example 26 wherein the second substrate does not comprise the molding material on a top surface of the second substrate.

Example 28 includes the method of forming the microelectronic package structure of example 26 wherein at least one of the at least one component is disposed within a cavity of the first substrate.

Example 29 includes the method of forming the microelectronic package structure of example 26 further comprising wherein the first substrate comprises a multiple component structure disposed on a top surface of the first substrate.

Example 30 includes the method of forming the microelectronic package structure of example 26 further comprising wherein a surface of the second substrate comprises an edge shielding structure.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A microelectronic package structure comprising:
   a first substrate, wherein the first substrate includes a cavity;
   a die on a top surface of the first substrate, adjacent the cavity;
   a component at least partially within the cavity;
   a molding material on the die and on the component, wherein the die and the component are embedded in the molding material;
   a second substrate, wherein the first substrate is on the second substrate; and
   a communication structure on the second substrate, wherein the communication structure is adjacent the first substrate.

2. The microelectronic package structure of claim 1 wherein a top surface of the second substrate is free from the molding material.

3. The microelectronic package structure of claim 1 wherein the second substrate comprises a low density routing substrate, wherein a routing density of the second substrate comprises about 40/40 L/S or greater.

4. The microelectronic package structure of claim 1 wherein a shielding material is on a top surface of the molding material.

5. The microelectronic package structure of claim 1 wherein a footprint of the first substrate does not overlap the communication structure.

6. The microelectronic package structure of claim 1 wherein the second substrate comprises an embedded trace substrate.

7. The microelectronic package structure of claim 1 further comprising an additional component on the top surface of the first substrate, adjacent the cavity.

8. The microelectronic package structure of claim 7 wherein the additional component comprises a height, wherein a height of the component that is at least partially within the cavity is greater than a height of the additional component.

* * * * *